United States Patent [19]

Sanford

[11] 4,139,816
[45] Feb. 13, 1979

[54] COPY PAPER TEST APPARATUS

[75] Inventor: Robert F. Sanford, Titusville, N.J.

[73] Assignee: Princeton Electro Dynamics, Inc., Princeton Junction, N.J.

[21] Appl. No.: 860,712

[22] Filed: Dec. 15, 1977

[51] Int. Cl.² .............................................. G01R 31/02
[52] U.S. Cl. ...................................... 324/72; 324/113
[58] Field of Search .............. 324/32, 72, 73 AT, 111, 324/113

[56] References Cited

U.S. PATENT DOCUMENTS

| | | | |
|---|---|---|---|
| 2,421,430 | 6/1947 | Ott | 324/32 |
| 3,364,423 | 1/1968 | Moulton | 324/72 |
| 3,544,889 | 12/1970 | Alauzet et al. | 324/72 |
| 3,818,201 | 6/1974 | Hartwich | 324/73 AT |

*Primary Examiner*—M. Tokar
*Attorney, Agent, or Firm*—Charles I. Brodsky

[57] ABSTRACT

Test apparatus which indicates the peak potential to which copy paper is charged, the surface potential remaining after a dark decay interval, and the potential remaining after a light exposure interval.

9 Claims, 2 Drawing Figures

COPY PAPER TEST APPARATUS

FIELD OF THE INVENTION

This invention relates to copy paper test apparatus and, more particularly, to such apparatus as accurately tests the characteristics of coated light sensitive papers in easy operations.

BACKGROUND OF THE INVENTION

Present day office copy machines use papers coated with zinc oxide and doped with dyes to increase their sensitivities to optical light. In their uses, these coated papers are charged to a peak potential at a first station in the machine, and then transported to another station where they are optically exposed to the item to be copied. However, the surface potential on the paper often decreases during the time of this transport. As is understood, this decrease in potential causes a decrease in the possible contrast of the reproduced print. Additionally, some potential may remain at the surface of the paper after it is exposed to the optical light. This residue attracts toner particles and gives the print a grayish background and a further reduction in contrast.

Many different factors affect the quality of the reproduced print. For example, the specific manufacture of the zinc oxide, the manufacture of the doping dyes, the manufacture of the paper, and the process of coating the paper with the oxide and dyes — all, in addition to the specific manufacture of the copy machine itself. Thus, investigations have shown that different qualities of print reproduction have been obtained for the same machine, but with different copy papers; and that different qualities have been obtained for the same papers, but in different copy machines. Although some suppliers of coated papers advertise a product acceptable for use in any one of many machines, results have shown a wide disparity in the quality of the print from machine to machine. Reasons for these differences include variations in the specific zinc oxide compositions manufactured, in the dye doping compositions, in the paper manufactures, in the coating processes employed — all, with the possible result that one brand of paper, while producing quite acceptable copy at one time for a given machine, could produce quite different results at a later time. Another reason for the variation in quality is that each machine manufacturer has the option of selecting the charging potential, transport time and light exposure interval for optimum results using its own recommended brand of paper, but such parameters may not produce optimum results with papers available from other manufacturers.

As will be readily appreciated by those skilled in the art, these variations in copy reproduction result from a lack of quality control in the industry. For example, if the quality of a reproduced print from one machine is somehow inferior to a prior print, the machine user cannot accurately determine whether the difficulty is due to the internal workings of the machine, to the coating process employed, or to the characteristics of the uncoated paper, the zinc oxide, or the doping dyes — all that he knows is that the reproduction has deteriorated. What is needed is a quality control, through pre-testing of the coated paper to be used, to facilitate an understanding that any deterioration in reproductive qualities is due to the machine itself, and not to any external factors.

SUMMARY OF THE INVENTION

As will become clear hereinafter, the test apparatus of the present invention provides an indication of the peak potential to which the coated paper is charged, the surface potential remaining after a first pre-selected period of time (the "dark decay time" during the transport interval), and the potential remaining after a second pre-selected period of time (the "light exposure interval"). Apparatus of this type can be used by the supplier of the finished coated paper to determine the effects such charging and decay will have on the paper sold by it. The coater of the paper, similarly, can use the apparatus to compare the coated paper against papers previously coated by it and known to be acceptable. The manufacturers of the zinc oxide and the doping dyes can similarly use the machine, to check the acceptability of their present chemical compositions, and to compare them against chemical compositions previously employed. Comparisons can also be made by the manufacturers of the uncoated papers and by the toner manufacturers, each in determining the adequacy of their present product against manufactures previously determined to provide acceptable reproductive prints. With the use of the apparatus of the invention, therefore, it becomes possible to determine whether the copy machine itself is performing unsatisfactorily, or whether the copy paper is the cause of the unsatisfactory performance — and, in the latter instant, exactly in what stage of the manufacture the difficulties lie.

BRIEF DESCRIPTION OF THE DRAWINGS

These and other features of the present invention will be more clearly understood from a consideration of the following description, taken in connection with the accompanying drawings in which.

DETAILED DESCRIPTION OF THE DRAWINGS

Figure 1:
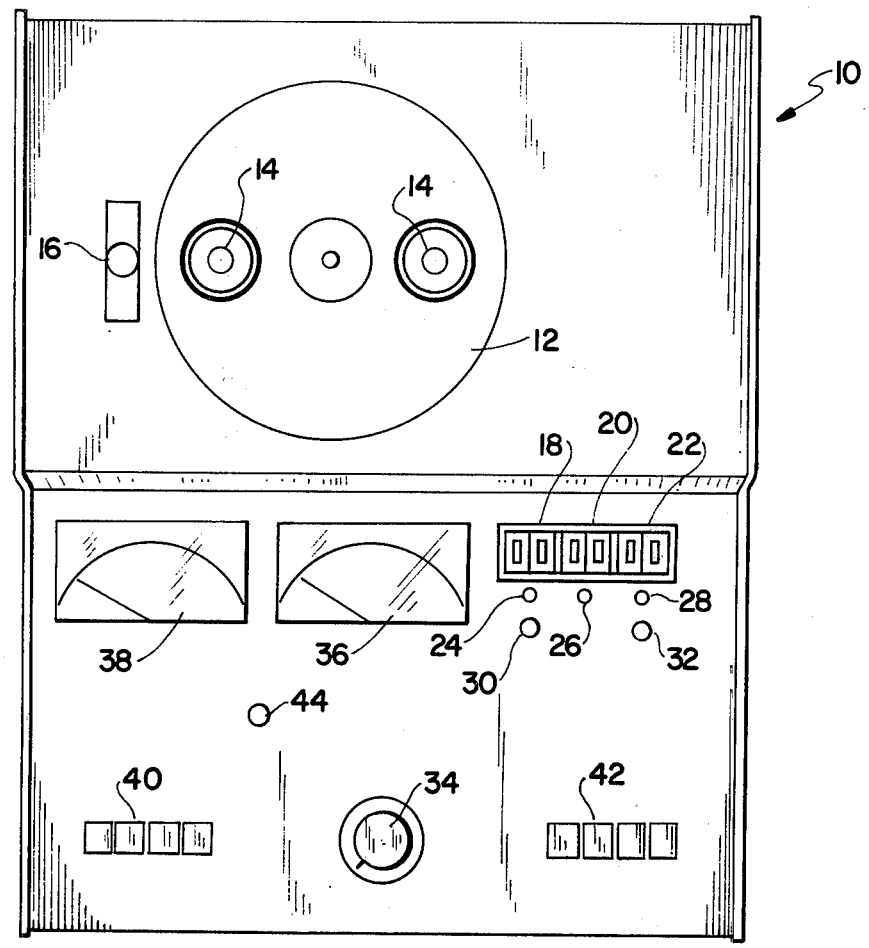
FIG. 1 is a front view of an embodiment of copy paper test apparatus constructed in accordance with the invention.

Referring now to FIG. 1, the copy paper test apparatus of the invention 10 includes a turntable 12 having a pair of ports 14 which house a sample disc of the coated paper to be tested. Such discs may be of 1" diameter, and inserted into the ports 14 with their coated sides down. A holder 16 is included for inserting a neutral density filter between a light source internal to the apparatus and the samples sequentially to be exposed to the light source as the turntable rotates. A pair of tweezers may be employed to place the discs in the ports 14, and a vacuum-squeeze bulb arrangement of appropriate configuration may be used to withdraw the discs after a test has been completed.

Three timers 18, 20, 22 are included for automatic programming operation of the apparatus, being digital in construction and adjustable from 1 to 99 secs. at 1 sec. increments. The first timer 18 is a "current charge timer," and sets the duration of corona charging. The second timer 20, on the other hand, is the "dark decay timer," for setting the duration of the inter-station transport. The third timer 22 is the "light source timer," for setting the duration of the light exposure. Three lamps 24, 26, 28 are included, respectively associated with the corona charging cycle, the dark decay cycle, and the light exposure cycle, to illuminate in turn as a test proceeds from the charging to the dark decay - to the light exposure steps. A pair of manual controls 30, 32 are shown, employable to manually control the corona charging and to manually control the light exposure, the times for which can be regulated by the user according to stop-watch directions, instead of being programmed automatically by the timers 18, 20, 22. These manual controls 30, 32 permit an extended charge acceptance and dielectric testing, calibration of the light source, and a determination of the desired program cycle.

An ion current control 34 is shown, and regulates the output to the corona wires which create the high intensity field for charging the samples in the ports 14. The meter 36 provides an indication as to the charging current employed at any given time. A second meter 38 indicates the potential to which the samples are charged, and a range selector push-button switch 40 is used, illustrated to provide four scale settings for the meter 38, e.g., 0–200 volts, 0–500 volts, 0–1,000 volts, 0–2,000 volts.

A system control push-button switch 42 is also included, which, from left to right in the drawing, when depressed, serves to deactivate the machine ("system off"), hold the machine in a standby position for sample loading ("standby on"), activate a manual motor for the turntable 12 ("manual on"), and activate the automatic programmer ("auto start"). Provision is made for employing a chart recorder to display characteristics of the sample disc, with a test control button 44 being provided to permit the operator to calibrate the chart recorder without having to run a sample — i.e., depressing the button 44 causes the meter 38 to deflect precisely full scale so as to allow an auxiliary chart recorder to be adjusted to the maximum scale desired.

In setting up the apparatus for a test, fresh disc samples are first inserted in the sample ports 14. The light source is then turned on, and appropriate filters are added via the holder 16 until an illumination on the samples is reached with simulates the light exposure on coated paper of the same composition when in place in the copy machine itself. Next, the ion control 34 is adjusted until meter 36 indicates the charging current to be substantially equal to that which is available in the copy machine. The chart recorder is then adjusted to provide a desired deflection, and its timer switches and vernier controls adjusted to approximately the time of the total test (the sum of the charge time, the dark decay time, and the light exposure time established by the manufacturer). Lastly, the range selector switch 40 is adjusted to provide the meter 38 with the scale setting as to which it is expected the samples to charge.

To manually test a sample disc, the "manual on" control 42 is activated, causing the turntable 12 to rotate. The current charge control 30 is then depressed, and held down for a time equal to the desired corona charging time suggested by the machine manufacturer. Voltmeter 38, at the end of this period, provides an indication of the peak potential to which the sample surface has been charged. After a further period equal to the dark decay time of the machine, the light source control 32 is depressed, and held down for the length of time suggested for light exposure of the coated paper. Prior to activating this control 32, a second voltmeter reading is taken, to determine to what potential the charge surface of the sample fell, if any. Similarly, at the end of the light exposure interval, a third voltmeter reading is taken, to determine whether any potential continues to remain on the sample. These readings with the test sample provide an indication as to what will happen in the copy machine with the coated paper from which the sample is taken, and, specifically, whether, and to what extent, there will be a reduction in contrast and/or a build-up of grayish background for the reproduced copy. After these readings are taken, the "standby on" control 42 is depressed, and the motor driven turntable 12 is stopped.

In the automatic operation of the test apparatus, on the other hand, — after fresh samples are in place in the ports 14, the light source is inserted and calibrated, the ion charging current is adjusted to the desired value, the chart recorder, if used, is properly adjusted, and the voltage range switch is depressed for the scale setting expected — the time for the charging, dark decay, and light exposure intervals are selected by the appropriate setting of the digital timers 18, 20, 22, according to the machine manufacturer's directions. The "auto start" system control 42 is then depressed, to activate the timing sequence established by the controls 18, 20, 22, after which (at the end of the entire cycle), the turntable 12 automatically stops and all functions are reset for another sample run. The "standby on" system control 42 may be depressed during the timing sequence, for premature interruption and resetting of all functions in readiness for a new sample run, activated by depressing the "auto start" system control button once again.

Figure 2:
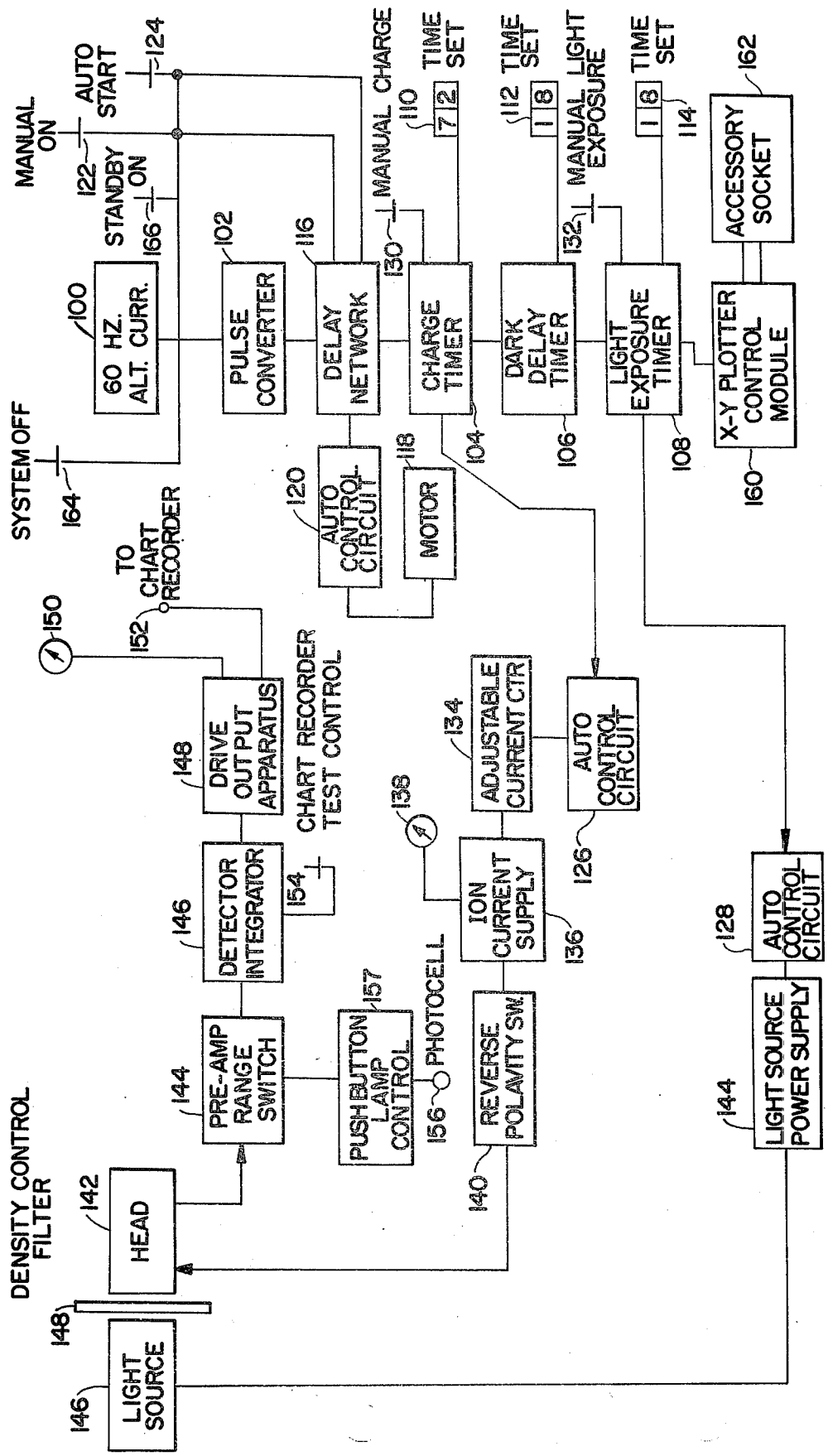
FIG. 2 is a block diagram of the apparatus of FIG. 1.

Referring now to the block diagram of FIG. 2, a source of 60Hz, 120 volts alternating current 100 is coupled to a pulse converter 102 for developing one second timing pulses as a master clock for the three digital timers. The charging timer, dark decay timer and light exposure timer are indicated by the reference numerals 104, 106, 108, respectively, each with its own programmable controls 110, 112, 114 for digitally determining the timing cycles at one sec. increments. For example, and as indicated, intervals of 72 secs., 15 secs., and 18 secs. may be set for establishing the appropriate timing cycles for testing one commercially available copy paper. A delay network 116 is coupled between the converter 102 and the charging timer 104 so as to inhibit the counting by the three timing circuits until a motor 118, coupled to the delay network 116, has reached its operating speed. An automatic control circuit 120, incorporating a relay arrangement, couples the delay network 116 to the motor 118, and is effective in energizing the motor to rotate the sample-carrying turntable when the either the "manual on" control switch 122 or "auto start" control switch 124 is depressed.

Additional automatic control circuits 126 and 128, each also including its own relay, serve to activate the corona charging system and the light exposure — the first, either when the manual charge control 130 is depressed, or automatically upon the initiation of the charge time cycle, and the second, either when the manual light exposure control 132 is depressed, or automatically upon the initiation of the light exposure cycle. An adjustable current control 134 regulates the corona charging current from an ion current power supply 136, as indicated on the ion current meter 138 on the front of the test apparatus, as in FIG. 1. At the same time, the regulated current from the power supply 136 is coupled, via a reverse polarity switch 140, to charge the samples in the ports of the rotating turntable head 142 with high voltage signals of either positive or negative polarity, depending upon the requirements of the copy paper being tested. The light exposure control circuit 128, on the other hand, regulates the output of power supply 144 to energize a light source 146, thereby illuminating the samples in the rotating head through a light density filter 148. As will be readily appreciated, the intervals for the charging, dark decay and light exposure cycles, the magnitude of the corona charging current, and the light illuminating the rotating samples are each preselected in accordance with suggested machine manufacturers' specifications for each sample being tested.

The rotating head of the system 142 incorporates a pair of cavity ports, such that as the charged surfaces pass across three included electrometer electrodes, a varying voltage is produced. Such output signal is preamplified in a control network 144 (where the appropriate range for eventual voltmeter display is selected), and thereafter detected and integrated in a second control network 146, for application, through drive output apparatus 148, to the voltmeter output 150 and to the chart recorder input 152. The chart recorder test control 154, when depressed, applies a sufficient current to cause the voltmeter 150 to read full scale with the turntable stationary, to thus permit an adjustment to be made in the chart recorder span for maximum deflection, without any need to load "fixed" samples selected for full scale meter deflection.

In one embodiment of the invention as constructed, back-lighted circuits were employed for the push-buttons on the voltage range selector switch and for the push-buttons for the "standby on," "manual on," and "auto start" system controls. With the "system off" push-button not illuminated, the remaining three system control buttons are interconnected such that when any one of the three is pressed, the back-lighting appears for all the system controls and for the voltage range selector switch. A photocell 156 is incorporated, located on the front of the machine apparatus, as an ambient light or brightness control for these push-buttons, dependent upon the level of the light in the room. The panel meters 138 and 150 are also lit, but are not controlled in illumination as a function of ambient light. As will be apparent, the apparatus of FIG. 2 also incorporates appropriate power supplies (not shown), for the counting circuits in the timing controls, for the electronic circuitry in the pre-amplifier, detector, integrator and drive apparatus, for the panel meter and back-lightings, and for the corona charging and light exposure.

As an alternative to using a chart recorder, the apparatus of the present invention is also designed to operate with an X-Y plotter accessory. To that end, a control module 160 is incorporated, to feed input information by means of an accessory socket 162 on the test apparatus to the external plotter. Such information can direct the start of the timer in the plotter at the appropriate time, the drop of the recorder pin so as to initiate the test, the lift of the pin after the timing cycle is over, and the return of the pin to its original starting point. As will be apparent, the X-Y plotter permits the use of 8½ × 11 inch graph paper to easily enable the plottings of one curve to be made over another in comparing samples, to permit the easy storage of the results in a loose leaf notebook, and to permit pre-printing of the graph paper for appropriate timing ranges, voltage ranges, and questionnaire information. In one construction of the invention, the accessory socket 162 was situated at the rear of the apparatus, into which an external X-Y plotter was plugged for accepting the signals there developed.

The "system off" and "standby on" controls 164, 166 are situate between the 60Hz source 100 and the pulse converter 102, and are mechanically coupled to one another. In particular, the mechanical coupling is such that when the "standby on" control, for example, is depressed, the "system off" control is automatically released for sample loading in the cavity ports. The "system off" control can be a detented push-button, such that when it is depressed, the apparatus would be turned off and remain off until the "standby on" control were itself activated. In one version of the invention, the 60Hz feed line is coupled to the converter 102 only through the "system off" control, such that when any of the other push-button controls are depressed, the "system off" control is mechanically moved in the direction to connect the 60Hz source directly to the pulse converter 102.

While there has been described what is considered to be a preferred embodiment of the present invention, it will be apparent to those skilled in the art that modifications may be made without departing from the teachings herein. For example, whereas the apparatus of the invention has been described in the context of testing copy paper characteristics, it will be recognized that the apparatus can be used to test the surface potential of other statically charged materials as well, e.g., plastics, films, fibers, hair, etc. For that reason, therefore, resort should be had to the claims annexed hereto for determining the true scope of this invention.

I claim:

1. In test equipment for analyzing the surface potential of coated light sensitive materials, apparatus comprising:
    a head for holding said materials in place;
    first means for rotating said head;
    second means for charging said materials at a predetermined current and for a predetermined interval of time;
    third means responsive to the rotations of said head for detecting the potential stored on said materials at any given instant of time;
    a source of light illumination; and
    fourth means for regulating the interval of current charging, an interval of light exposure illuminating said light sensitive materials and the time at which the potential stored on said materials is detected for analysis.

2. The apparatus of claim 1 wherein there is also included a source of timing control signals and wherein said fourth means pre-programs said control signal source to automatically regulate the interval of current charging, the interval of light exposure illuminating said sensitive materials and the instant of time at which the stored potential on said materials is detected.

3. The apparatus of claim 1 wherein fifth means are included to display the potential stored on said materials as a function of time.

4. The apparatus of claim 3 wherein said fifth means includes a voltmeter and a chart recorder, and wherein sixth means are included to provide a full scale deflection on said meter for calibrating said recorder prior to analysis of the potential detected.

5. The apparatus of claim 3 wherein said fifth means includes a voltmeter and an output signal source providing control signals effective to energize an X-Y plotter into operation.

6. The apparatus of claim 2 wherein said fourth means also pre-programs said control signal source to establish a time lapse between the intervals of current charging and light exposure illumination, and wherein said fourth means additionally pre-programs said control signal source to provide detections of the potential stored on said light sensitive materials upon conclusion of the current charging interval, the intervening interval, and the light exposure illumination interval.

7. The apparatus of claim 6 wherein said coated light sensituve material comprises electrostatic copy paper, and wherein said second means charges said electrostatic copy paper at a current substantially equal to the current charging said paper when in a copier machine in which it is intended for use.

8. The apparatus of claim 7 wherein said fourth means pre-programs said current charging and light exposure illumination intervals at intervals substantially equal to the current charging and light exposure intervals for said paper when in said copier machine.

9. The apparatus of claim 8 wherein said fourth means also programs said intervening interval substantially equal to the dark decay interval for said paper when in said machine.

* * * * *